(12) United States Patent
Pan

(10) Patent No.: US 10,970,162 B2
(45) Date of Patent: *Apr. 6, 2021

(54) FEEDBACK SIGNALING ERROR DETECTION AND CHECKING IN MIMO WIRELESS COMMUNICATION SYSTEMS

(71) Applicant: InterDigital Technology Corporation, Wilmington, DE (US)

(72) Inventor: Kyle Jung-Lin Pan, Saint James, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/389,205

(22) Filed: Apr. 19, 2019

(65) Prior Publication Data
US 2019/0250983 A1 Aug. 15, 2019

Related U.S. Application Data

(63) Continuation of application No. 16/017,559, filed on Jun. 25, 2018, now Pat. No. 10,318,374, which is a (Continued)

(51) Int. Cl.
*G06F 11/00* (2006.01)
*H03M 13/00* (2006.01)
(Continued)

(52) U.S. Cl.
CPC ..... *G06F 11/1004* (2013.01); *H03M 13/2957* (2013.01); *H04B 7/0413* (2013.01);
(Continued)

(58) Field of Classification Search
CPC ... H04L 1/0073; H04L 1/0076; H04L 1/0026; H04L 1/1607; H04L 2025/03426;
(Continued)

(56) References Cited

U.S. PATENT DOCUMENTS 6,300,288 B1  10/2001  Scharf et al.
6,330,288 B1  12/2001  Budka et al.
(Continued)

FOREIGN PATENT DOCUMENTS

CN  1630380 A  6/2005
CN  1720698    1/2006
(Continued)

OTHER PUBLICATIONS

"3GPP, RAN1_49BIS Attendees List", Orlando, Jun. 25-29, 2007, 4 pages.
(Continued)

*Primary Examiner* — Guerrier Merant
(74) *Attorney, Agent, or Firm* — Flaster Greenberg, P.C.

(57) ABSTRACT

A method of feedback in a wireless transmit receive unit includes providing a precoding matrix index (PMI), error checking the (PMI) to produce an error check (EC) bit, coding the PMI and the EC bit and transmitting the coded PMI and EC bit.

20 Claims, 6 Drawing Sheets

Related U.S. Application Data continuation of application No. 15/160,034, filed on May 20, 2016, now Pat. No. 10,037,243, which is a continuation of application No. 14/678,560, filed on Apr. 3, 2015, now Pat. No. 9,459,954, which is a continuation of application No. 14/196,843, filed on Mar. 4, 2014, now Pat. No. 9,048,998, which is a continuation of application No. 13/922,833, filed on Jun. 20, 2013, now Pat. No. 8,707,129, which is a continuation of application No. 13/437,343, filed on Apr. 2, 2012, now Pat. No. 8,572,461, which is a continuation of application No. 12/112,636, filed on Apr. 30, 2008, now Pat. No. 8,171,372.

(60) Provisional application No. 60/915,040, filed on Apr. 30, 2007.

(51) Int. Cl.
| | | |
|---|---|---|
| *G06F 11/10* | (2006.01) | |
| *H04L 1/00* | (2006.01) | |
| *H03M 13/29* | (2006.01) | |
| *H04B 7/0456* | (2017.01) | |
| *H04L 1/18* | (2006.01) | |
| *H04L 5/00* | (2006.01) | |
| *H04W 72/04* | (2009.01) | |
| *H04B 7/0413* | (2017.01) | |
| *H04B 7/06* | (2006.01) | |
| *H04L 1/16* | (2006.01) | |
| *H04L 25/03* | (2006.01) | |

(52) U.S. Cl.
CPC ......... *H04B 7/0456* (2013.01); *H04B 7/0632* (2013.01); *H04L 1/0041* (2013.01); *H04L 1/0045* (2013.01); *H04L 1/0061* (2013.01); *H04L 1/0073* (2013.01); *H04L 1/0076* (2013.01); *H04L 1/1812* (2013.01); *H04L 1/1861* (2013.01); *H04L 5/0092* (2013.01); *H04W 72/0413* (2013.01); *H04L 1/0026* (2013.01); *H04L 1/1607* (2013.01); *H04L 25/03343* (2013.01); *H04L 2025/03426* (2013.01); *H04L 2025/03802* (2013.01)

(58) Field of Classification Search
CPC ..... H04L 2025/03802; H04L 25/03343; H04L 1/0041; H04L 1/0061; H04L 1/1812; H04L 5/0092; H03M 13/2957; H04W 72/0413; G06F 11/1004; H04B 7/0456
See application file for complete search history.

(56) References Cited

U.S. PATENT DOCUMENTS

| | | |
|---|---|---|
| 6,567,938 B2 | 5/2003 | Wan |
| 6,961,388 B2 | 11/2005 | Ling et al. |
| 7,330,700 B2 | 2/2008 | Aizawa |
| 7,697,622 B2 | 4/2010 | Han et al. |
| 7,826,557 B2 | 11/2010 | Li et al. |
| 7,881,395 B2 | 2/2011 | Lee et al. |
| 7,885,202 B2 | 2/2011 | Li et al. |
| 8,572,461 B2 | 10/2013 | Pan |
| 8,707,129 B2 * | 4/2014 | Pan ...................... H04L 1/1861 714/758 |
| 9,048,998 B2 * | 6/2015 | Pan ...................... H04L 1/1861 |
| 9,413,489 B2 | 8/2016 | Cai et al. |
| 9,459,954 B2 | 10/2016 | Pan |
| 2003/0123409 A1 | 7/2003 | Kwak et al. |
| 2004/0015603 A1 | 1/2004 | Griessbach et al. |
| 2004/0022213 A1 | 2/2004 | Choi et al. |
| 2004/0027994 A1 | 2/2004 | Baines |
| 2004/0110473 A1 | 6/2004 | Rudolf et al. |
| 2004/0127221 A1 | 7/2004 | Takano et al. |
| 2004/0199814 A1 | 10/2004 | Kim et al. |
| 2005/0094596 A1 | 5/2005 | Pietraski et al. |
| 2005/0191965 A1 | 9/2005 | Yu et al. |
| 2005/0207367 A1 | 9/2005 | Onggosanusi et al. |
| 2005/0207376 A1 | 9/2005 | Ashwood-Smith et al. |
| 2006/0039489 A1 | 2/2006 | Ikram et al. |
| 2006/0062217 A1 | 3/2006 | Kim et al. |
| 2006/0209880 A1 | 9/2006 | Chang et al. |
| 2006/0209980 A1 | 9/2006 | Kim et al. |
| 2006/0274712 A1 | 12/2006 | Malladi et al. |
| 2007/0041429 A1 | 2/2007 | Khandekar |
| 2007/0217540 A1 | 9/2007 | Onggosanusi et al. |
| 2007/0220151 A1 | 9/2007 | Li et al. |
| 2008/0012764 A1 | 1/2008 | Kang et al. |
| 2008/0080431 A1 | 4/2008 | Zeira et al. |
| 2008/0141104 A1 | 6/2008 | Miyazaki et al. |
| 2009/0041140 A1 | 2/2009 | Xiao et al. |
| 2009/0131113 A1 | 5/2009 | Shiizaki et al. |
| 2009/0147866 A1 | 6/2009 | She et al. |
| 2009/0175161 A1 | 7/2009 | Yi et al. |
| 2010/0110982 A1 | 5/2010 | Roh et al. |
| 2010/0192037 A1 | 7/2010 | Kuri et al. |
| 2016/0330639 A1 | 11/2016 | Cai et al. |

FOREIGN PATENT DOCUMENTS

| | | |
|---|---|---|
| CN | 1780278 A | 5/2006 |
| CN | 1790976 A | 6/2006 |
| CN | 1808962 A | 7/2006 |
| CN | 1893335 A | 1/2007 |
| EP | 1388966 A2 | 2/2004 |
| EP | 1469641 A2 | 10/2004 |
| EP | 1628405 A2 | 2/2006 |
| EP | 1628415 A1 | 2/2006 |
| EP | 1334573 B1 | 6/2006 |
| JP | 62-73826 A | 4/1987 |
| JP | S62-73826 A | 4/1987 |
| JP | 7-336364 A | 12/1995 |
| JP | 2000-515715 A | 11/2000 |
| JP | 2004-147050 A | 5/2004 |
| JP | 2005-501038 A | 1/2005 |
| JP | 2006-509478 A | 3/2006 |
| JP | 2010-506580 A | 3/2010 |
| KR | 10-2014-0108584 A | 9/2014 |
| KR | 10-2015-0058542 A | 5/2015 |
| WO | WO 1999/052216 A2 | 10/1999 |
| WO | WO 2006/023832 A2 | 3/2006 |
| WO | WO 2008/001192 A2 | 1/2008 |
| WO | WO 2008/042255 A2 | 4/2008 |
| WO | WO 2008/047134 A2 | 4/2008 |
| WO | WO 2008/137430 A1 | 11/2008 |

OTHER PUBLICATIONS

"3GPP, RAN1_50 Attendees List", Athens, Aug. 20-24, 2007, 5 pages.
"Tdoc List RAN1 #49", May 7-11, 2007, 15 pages.
"Tdoc List RAN1 #49b", Jun. 25-29, 2007, 14 pages.
"Tdoc List RAN1 #50", Aug. 20-24, 2007, 15 pages.
"3GPP TSG RAN Working Group 1 (Layer 1)", List of WG1 Temporary Documents, Mar. 26-30, 2007, 13 pages.
"Participants_3GPPRAN1#48bis", Mar. 26-30, 2007, 4 pages.
"Participants_3GPPRAN1#49", May 7-11, 2007, 3 pages.
3rd Generation Partnership Project (3GPP), R1-01-1037, "Variable Rate Channel Quality Indication in HSDPA", Lucent Technologies, 3GPP TSG-RAN WG1#22, JeJu, Korea, Nov. 19-23, 2001, 16 pages.
3rd Generation Partnership Project (3GPP), R1-051045, "CQI Report and Scheduling Procedure", Samsung, 3GPP TSG-RAN WG1 Meeting #42bis, San Diego, USA, Oct. 10-14, 2005, 4 pages.
3rd Generation Partnership Project (3GPP), R1-061819, "Overhead Reduction of UL CQI Signaling for E-UTRA DL", Huawei, 3GPP TSG RAN LTE Ad Hoc, Cannes, France, Jun. 27-30, 2006, pp. 1-9.
3rd Generation Partnership Project (3GPP), R1-062575, "Further Analysis on DCT Based CQI Reporting Scheme", LG Electronics,

(56) References Cited

OTHER PUBLICATIONS

3GPP TSG RAN WG1 #46-bis, Seoul, Republic of Korea, Oct. 9-13, 2006, pp. 1-14.

3rd Generation Partnership Project (3GPP), R1-063029, "Control of CQI Feedback Signalling in E-UTRA", Philips, 3GPP TSG RAN WG1 Meeting #47, Riga, Latvia, Nov. 6-10, 2006, 3 pages.

3rd Generation Partnership Project (3GPP), R1-063087, "Further Impacts of Uplink Control Signaling Multiplexing Scheme", Huawei, 3GPP TSG-RAN WG1 Meeting # 47, Riga, Latvia, Nov. 6-10, 2006, 4 pages.

3rd Generation Partnership Project (3GPP), R1-063094, "Comparison of CQI Feedback Schemes", Mitsubishi Electric, 3GPP TSG RAN WG1 #47, Riga, Latvia, Nov. 6-10, 2006, 9 pages.

3rd Generation Partnership Project (3GPP), R1-063185, "E-UTRA Downlink System Level Performance with Compressed CQI Feedback", Panasonic, 3GPP TSG-RAN WG1 Meeting #47, Riga, Latvia, Nov. 6-10, 2006, 5 pages.

3rd Generation Partnership Project (3GPP), R1-063191, "Non-Data-Associated Control Signaling", ZTE, 3GPP TSG-RAN WG1 #47, Riga, Lativa, Nov. 6-10, 2006, 3 pages.

3rd Generation Partnership Project (3GPP), R1-063204, "Compressed CQI Reporting.Scheme", NEC Group, 3GPP TSG RAN WG1 Meeting #47, Riga, Latvia, Nov. 6-10, 2006, 8 pages.

3rd Generation Partnership Project (3GPP), R1-063268, "CQI Reporting for E-UTRA", Samsung, 3GPP TSG RAN WG1 Meeting #47, Riga, Latvia, Nov. 6-10, 2006, 3 pages.

3rd Generation Partnership Project (3GPP), R1-063269, "Uplink Data-Associated Control Signalling", Samsung, 3GPP TSG RAN WG1 Meeting #47, Riga, Latvia, Nov. 6-10, 2006, 2 pages.

3rd Generation Partnership Project (3GPP), R1-063320, "CDMA-Based Multiplexing Method for Multiple ACK/NACK and CQI in E-UTRA Uplink", NTT DoCoMo, Fujitsu, KDDI, Mitsubishi Electric, Sharp, Toshiba Corporation, 3GPP TSG RAN WG1 Meeting #47, Riga, Latvia, Nov. 6-10, 2006, 7 pages.

3rd Generation Partnership Project (3GPP), R1-063354, "CDMA Based Multiplexing of ACK/NACK and CQI Control Information in E-UTRA Uplink", KDDI, NYY DoCoMo, 3GPP TSG RAN WG1 Meeting #47, Riga, Latvia, Nov. 6-10, 2006, 4 pages.

3rd Generation Partnership Project (3GPP), R1-063384, "CQI Design and its Impact to DL Performance", Nokia, 3GPP TSG RAN WG1#47, Riga, Latvia, Nov. 6-10, 2006, 7 pages.

3rd Generation Partnership Project (3GPP), R1-063448, "Structure and Link Analysis UL Control Signaling", Qualcomm Europe, 3GPP TSG-RAN WG1 #47, Riga, Latvia, Nov. 6-10, 2006, 10 pages.

3rd Generation Partnership Project (3GPP), R1-063579, "CDMA based Multiplexing of ACK/NACK and CQI Control Information in E-UTRA Uplink", KDDI, NTT DoCoMo, 3GPP TSG RAN WG1 Meeting #47, Riga, Latvia, Nov. 6-10, 2006, 4 pages.

3rd Generation Partnership Project (3GPP), R1-070437, "Proposed Structure for UL ACK and CQI", Qualcomm Europe, 3GPP TSG RAN1 #47-bis, Sorrento, Italy, Jan. 15-19, 2007, 3 pages.

3rd Generation Partnership Project (3GPP), R1-070521, "CDMA based Multiplexing of ACK/NACK and CQI Control Information in E-UTRA Uplink", KDDI, NTT DoCoMo, 3GPP TSG RAN WG1 Meeting #47bis, Sorrento, Italy, Jan. 15-19, 2007, 5 pages.

3rd Generation Partnership Project (3GPP), R1-070633, "Approved Report of 3GPP TSG RAN WG1 #47 (Riga, Latvia, Nov. 6-10, 2006)", MCC Support, 3GPP TSG RAN WG1 Meeting #47bis, Sorrento, Italy, Jan. 15-19, 2007, 112 pages.

3rd Generation Partnership Project (3GPP), R1-070685, "Further Evaluation of CQI Feedback Schemes", Mitsubishi Electric, 3GPP TSG RAN WG1 #48, St. Louis, USA, Feb. 12-16, 2007, 10 pages.

3rd Generation Partnership Project (3GPP), R1-070777, "Multiplexing of Uplink Control Signaling with Data", Motorola, 3GPP TSG RAN1 #48, St. Louis, USA, Feb. 12-16, 2007, 3 pages.

3rd Generation Partnership Project (3GPP), R1-070779, "CQI Feedback Schemes for E-UTRA", Motorola, 3GPP TSG RAN1#48, St. Louis, US, Feb. 12-16, 2007, 5 pages.

3rd Generation Partnership Project (3GPP), R1-070879, "Compressed CQI Reporting Scheme", NEC Group, 3GPP TSG RAN WG1 Meeting #48, St. Louis, U.S., Feb. 12-16, 2007, 8 pages.

3rd Generation Partnership Project (3GPP), R1-071000, "Data-Non-Associated Control Signal Transmission with UL Data", Nokia, 3GPP TSG RAN WG1 Meeting #48, St. Louis, USA, Feb. 12-16, 2007, 5 pages.

3rd Generation Partnership Project (3GPP), R1-071245, "Approved Report of 3GPP TSG RAN WG1 #47bis v2.0.0 (Sorrento, Italy, Jan. 15-19, 2007)", MCC Support, 3GPP TSG RAN WG1 Meeting #48, St Louis, US, Feb. 12-16, 2007, 119 pages.

3rd Generation Partnership Project (3GPP), R1-071271, "Draft Report of 3GPP TSG RAN WG1 #48 v0.2.0 (St. Louis, USA, Feb. 12-16, 2007)", MCC Support, 3GPP TSG RAN WG1 Meeting #48bis, St. Julian, Malta, Mar. 26-30, 2007, 121 pages.

3rd Generation Partnership Project (3GPP), R1-071343, "Precoding Feedback Overhead", Motorola, 3GPP TSG RAN WG1, Mar. 26-30, 2007, 4 pages.

3rd Generation Partnership Project (3GPP), R1-071429, "UL L1/L2 Control Signals with Data: Multiplexing Detail", Motorola, 3GPP TSG RAN1 #48-bis, St. Julian's, Malta, Mar. 26-30, 2007, 3 pages.

3rd Generation Partnership Project (3GPP), R1-071459, "Signaling Support for Downlink MIMO Mode Adaption", Nortel, 3GPP TSG-RAN Working Group 1 Meeting #48bis, Mar. 26-30, 2007, pp. 1-4.

3rd Generation Partnership Project (3GPP), R1-071465, "Binary Differential Feedback Scheme for Downlink MIMO Pre-Coding for E-UTRA", InterDigital Communications Corporation, 3GPP TSG RAN WG1 Meeting #48bis, St. Julians, Malta, Mar. 26-30, 2007, 11 pages.

3rd Generation Partnership Project (3GPP), R1-071502, "Multiplexing of Uplink Data-Non-Associated Control Signal with Data", NEC Group, NTT DoCoMo, 3GPP TSG RAN WG1 Meeting #48bis, St. Julian's, Malta, Mar. 26-30, 2007, 4 pages.

3rd Generation Partnership Project (3GPP), R1-071573, "Uplink Data-Non-Associated Control Signaling", Samsung, 3GPP TSG RAN WG1 #48bis, Mar. 26-30, 2007, pp. 1-4.

3rd Generation Partnership Project (3GPP), R1-071575, "Uplink Control Signal Transmission in Presence of Data", Samsung, 3GPP TSG RAN WG1 Meeting #48bis, St. Julians, Malta, Mar. 26-30, 2007, 3 pages.

3rd Generation Partnership Project (3GPP), R1-071652, "Basic Method for CQI Feedback in E-UTRA", NTT DoCoMo, Fujitsu, Sharp, 3GPP TSG RAN WG1 Meeting #48bis, Mar. 26-30, 2007, 4 pages.

3rd Generation Partnership Project (3GPP), R1-071679, "ACK/NACK Transmission with UL Data", Nokia, Siemens, 3GPP TSG RAN WG1 Meeting #48bis, St Julian's, Malta, Mar. 26-30, 2007, 4 pages.

3rd Generation Partnership Project (3GPP), R1-071712, "Precoding Matrix Feedback BER Requirements", Motorola, 3GPP TSG RAN WG1, St. Julian, Malta, Mar. 26-30, 2007, 3 pages.

3rd Generation Partnership Project (3GPP), R1-071727, "Data Puncturing and Piggy-Backed Control", Freescale Semiconductor, 3GPP TSG-RAN1 #48bis, St. Julians, Malta, Mar. 26-30, 2007, 3 pages.

3rd Generation Partnership Project (3GPP), R1-071808, "Haar-Based Compression for CQI Feedback", InterDigital Communications Corporation, 3GPP TSG RAN WG1 Meeting #48bis, St. Julians, Malta, Mar. 26-30, 2007, 7 pages.

3rd Generation Partnership Project (3GPP), R1-072001, "Draft Report of 3GPP TSG RAN WG1 #48b v0.3.0 (St. Julian, Malta, Mar. 26-30, 2007)", MCC Support, 3GPP TSG RAN WG1 Meeting #49, Kobe, Japan, May 7-11, 2007, 49 pages.

3rd Generation Partnership Project (3GPP), R1-072098, "Comparison of Different CQI Transmission Structures", Huawei, 3GPP TSG-RAN-WG1 Meeting #49, Kobe, Japan, May 7-11, 2007, 3 pages.

3rd Generation Partnership Project (3GPP), R1-072099, "System Level Evaluation of CQI Compression Schemes for E-UTRA", Huawei, 3GPP TSG-RAN-WG1 Meeting #49, Kobe, Japan, May 7-11, 2007, 8 pages.

(56) References Cited

OTHER PUBLICATIONS

3rd Generation Partnership Project (3GPP), R1-072554, "Performance Evaluation of Haar-Based Compression for CQI Feedback for E-UTRA", InterDigital Communications Corporation, 3GPP TSG RAN WG1 Meeting #49, Kobe, Japan, May 7-11, 2007, 11 pages.
3rd Generation Partnership Project (3GPP), R1-072590, "Proposed Way Forward for CQI Feedback Control and Content in E-UTRA", Panasonic, Mitsubishi Electric, Philips, NTT DoCoMo, Huawei, 3GPP TSG-RAN WG1 Meeting #49, Kobe, Japan, May 7-11, 2007, 2 pages.
3rd Generation Partnership Project (3GPP), R1-072646, "Draft Report of 3GPP TSG RAN WG1 #49 v0.4.0 (Kobe, Japan, May 7-11, 2007)", MCC Support, 3GPP TSG RAN WG1 Meeting #49b, Orlando, Florida—USA, Jun. 25-29, 2007, 56 pages.
3rd Generation Partnership Project (3GPP), R1-073815, "Draft Report of 3GPP TSG RAN WG1 #49b v0.3.0 (Orlando, Florida—USA, Jun. 25-29, 2007)", MCC Support, 3GPP TSG RAN WG1 Meeting #50, Athens, Greece, Aug. 20-24, 2007, 52 pages.
3rd Generation Partnership Project (3GPP), R1-073896, "Draft Report of 3GPP TSG RAN WG1 #50 v0.2.0 (Athens, Greece, Aug. 20-24, 2007)", MCC Support, 3GPP TSG RAN WG1 Meeting #50b, Shanghai, China, Oct. 8-12, 2007, 59 pages.
3rd Generation Partnership Project (3GPP), TS 36.212 V8.2.0, "Technical Specification Group Radio Access Network, Evolved Universal Terrestrial Radio Access (E-UTRA), Multiplexing and Channel Coding (Release 8)", Mar. 2008, pp. 1-38.
3rd Generation Partnership Project (3GPP), TS 36.213 V8.2.0, "Technical Specification Group Radio Access Network, Evolved Universal Terrestrial Radio Access (E-UTRA), Physical Layer Procedures (Release 8)", Mar. 2008, pp. 1-30.
3rd Generation Partnership Project (3GPP), TSG R1 #4(99) 464, "Additional CRCs for the Channel Coding", Nortel Networks, TSG-RAN Working Group 1 Meeting #4, Yokohama, Japan, Apr. 18-22, 1999, 3 pages.
3rd Generation Partnership Project (3GPP), TSGR1(01)1204, "Performance Requirements for Channel Quality Signalling", Philips, TSG RAN WG1 #22, Jeju, South Korea, Nov. 19-23, 2001, 3 pages.
Chen et al., "Theoretical Analysis of GPRS Throughput and Delay", Submitted to IEEE International Conference on Communications, Jun. 2004, 27 pages.
European Telecommunications Standards Institute (ETSI), TS 136 212 V8.8.0, "LTE, Evolved Universal Terrestrial Radio Access (E-UTRA), Multiplexing and Channel Coding (3GPP TS 36.212 version 8.8.0 Release 8)", Jan. 2010, 62 pages.
Koopman et al., "Cyclic Redundancy Code (CRC) Polynomial Selection for Embedded Networks", The International Conference on Dependable Systems and Networks, Jan. 1, 2004, 11 pages.
"Grounds of Invalidity for EP 714", Submitted by Defendants Levovo group Limited et al, in the High Court of Justice, Business and Property Courts of England and Wales, Claim No. HP 2019-000032, Sep. 28, 2020, 3 pages.
"The Defendants' Statement of Case on Validity EP (UK) 2,557,714", Submitted by Defendants Levovo group Limited et al, in the High Court of Justice, Business and Property Courts of England and Wales, Claim No. HP 2019-000032, Sep. 30, 2020, 3 pages.
"Annex to the Defendants' Statement of Case on Validity EP (UK) 2,557,714", Submitted by Defendants Levovo group Limited et al, in the High Court of Justice, Business and Property Courts of England and Wales, Claim No. HP 2019-000032, Sep. 30, 2020, 8 pages.
3$^{rd}$ Generation Partnership Project (3GPP); R1-081370, "Coding of Control Information on Pusch", Texas Instruments, 3GPP TSG RAN WG1, Meeting # 52bis, Shenzhen, China, Mar. 31-Apr. 4, 2008, 4 pages.
3$^{rd}$ Generation Partnership Project (3GPP), R1-071573, "Uplink data-non-associated control signaling", Samsung, 3GPP TSG RAN WG1, Meeting # 48 bis, St. Julian's, Malta, Mar. 26-30, 2007, 4 pages.

3$^{rd}$ Generation Partnership Project (3GPP), Tdoc R1-J01-1135, "Uplink Qi signaling with error-detection capability", LG Electronics, Inc., TSG-RAN Working Group 1, Meeting #22, Jeju, Korea, Nov. 19-23, 2001, 7 pages.
3$^{rd}$ Generation Partnership Project (3GPP), R1-071487, "Design Aspects of MIMO-Related UE Feedback", Texas Instruments, 3GPP TSG RAN WG1, Meeting #48 bis, St. Julian's, Malta, Mar. 26-30, 2007, 4 pages.
3$^{rd}$ Generation Partnership Project (3GPP), R1-071459, "Signaling Support for Downlink MIMO Mode Adaptation", Nortel, 3GPP TSG RAN Working Group 1, Meeting #48 bis, St. Julian's, Malta, Mar. 26-30, 2007, 4 pages.
Toskala, et al, WCDMA for UMTS, "High-speed Downlink Packet Access", Chapter 11, 26 pages including pp. 279-304, 2002.
3$^{rd}$ Generation Partnership Project (3GPP), 3GPP TS 25.308 V6.4.0, "Technical Specification Group Radio Access Network; High Speed Downlink Packet Access (HSDPA); Overall description; Stage 2 (Release 6)", Mar. 2007, 29 pages.
Yunali, Tongxin, "Principles of Communications", Beijing University of Posts and Telecommunications Press, Nov. 2005, 2019-NLC-GCzM-0815, 18 pages.
3$^{rd}$ Generation Partnership Project (3GPP), R1-081157, "Draft CR to 36.212 incorporating decisions form RAN1#5 1bis and RAN1#52", Qualcomm Europe, 3GPP TSG-WG1, Meeting #52, Sorrento, Italy, Feb. 11-15, 2008, 35 pages.
Tanner, et al., WCDMA Requirements and Practical Design, 2004, 18 pages including pp. 137 and 138.
Yunali, Tongxin, "Principles of Communications", Beijing University of Posts and Telecommunications Press, Nov. 30, 2005, pp. 226-240.
"Examination Decision on Petition for Invalidation", *Huawei Technology Co., Ltd..* vs. *InterDigital Technology Corporation*, National Intellectual Property Administration, PRC, Case No. 4W108784, Jan. 10, 2020, 10 pages.
3$^{rd}$ Generation Partnership Project (3GPP), R1-063613, "Approved Report of 3GPP TSG RAN WG1 #46bis", MCC Support, 3GPP TSG RAN WG1, Meeting #47, Riga, Latvia, Nov. 6-10, 2006, 102 pages.
3$^{rd}$ Generation Partnership Project (3GPP), R1-070777, "Multiplexing of Uplink Control Signaling with Data", Motorola, 3GPP TSG RAN1, Meeting #48, St. Louis, USA, Feb. 12-16, 2007, 3 pages.
3$^{rd}$ Generation Partnership Project (3GPP), R1-071418, "Uplink overhead for CQI and MIMO feedback in E-UTRA", Huawei, TSG RAN WG1, Meeting #48bis, St. Julian, Malta, Mar. 26-30, 2007, 5 pages.
3$^{rd}$ Generation Partnership Project (3GPP), R1-063470, "Precoding Feedback Overhead", Motorola, 3GPP TSG RAN WG1, Riga, Latvia, Nov. 6-10, 2006, 4 pages.
3$^{rd}$ Generation Partnership Project (3GPP), 3GPP TS 36.211 V1.0.0, "Technical Specification Group Radio Access Network; Physical Channels and Modulation (Release)", Mar. 2007, 30 pages.
3$^{rd}$ Generation Partnership Project (3GPP), 3GPP TS 36.212 V1.0.0, "Technical Specification Group Radio Access Network; Multiplexing and channel coding (Release 8)", Mar. 2007, 15 pages.
3$^{rd}$ Generation Partnership Project (3GPP), 3GPP TS 25.302 V.6.6.0, "Technical Specification Group Radio Access Network, Services Provided by the Physical Layer (Release 6)", Mar. 2006, pp. 1-74.
3$^{rd}$ Generation Partnership Project (3GPP), 3GPP TS 25.321 V6.7.0, "Technical Specification Group Radio Access Network, Medium Access Control (MAC) Protocol Specification (Release 6)", Dec. 2005, pp. 1-91.
3$^{rd}$ Generation Partnership Project (3GPP), TS 25.211 V6.7.0, "Technical Specification Group Radio Access Network, Physical Channels and Mapping of Transport Channels onto Physical Channels (FDD) (Release 6)", Dec. 2005, pp. 1-50.
3$^{rd}$ Generation Partnership Project (3GPP), TS 25.212 V6.7.0, "Technical Specification Group Radio Access Network, Multiplexing and Channel Coding (FDD) (Release 6)", Dec. 2005, pp. 1-84.
3$^{rd}$ Generation Partnership Project (3GPP), TS 36.212 V8.8.0, "Technical Specification Group Radio Access Network, Evolved Universal Terrestrial Radio Access (E-UTRA), Multiplexing and Channel Coding (Release 8)", Dec. 2009, pp. 1-60.

(56) References Cited

OTHER PUBLICATIONS

Su, Shing-Fong, "Introduction to UMTS Air Interface and Wireless Engineering", Lucent Technologies, Inc., Posts and Telecom Press, 2006, 53 pages.

3$^{rd}$ Generation Partnership Project (3GPP), TS 25.214 V6.9.0, "Technical Specification Group Radio Access Network, Physical Layer Procedures (FDD) (Release 6)", Jun. 2006, pp. 1-59.

3$^{rd}$ Generation Partnership Project (3GPP), TS 25.301, V6.4.0, Technical Specification Group Radio Access Network; Radio Interface Protocol Architecture (Release 6), Sep. 2005, pp. 1-48.

Listserv 16.5 3rd Generation Partnership (3GPP), 3GPP TSG RAN WG1 Archives, Moulsley Email Chain to Hyuck-Chan Kwon, dated Nov. 16-18 , 2001, 3 pages.

* cited by examiner

FEEDBACK SIGNALING ERROR DETECTION AND CHECKING IN MIMO WIRELESS COMMUNICATION SYSTEMS

CROSS REFERENCE TO RELATED APPLICATIONS

This application is a continuation of U.S. patent application Ser. No. 16/017,559, filed Jun. 25, 2018, which is a continuation of U.S. patent application Ser. No. 15/160,034, filed May 20, 2016; which issued as U.S. Pat. No. 10,037,243 on Jul. 31, 2018, which is a continuation of U.S. patent application Ser. No. 14/678,560, filed Apr. 3, 2015, which issued as U.S. Pat. No. 9,459,954 on Oct. 4, 2016; which is a continuation of U.S. patent application Ser. No. 14/196,843, filed Mar. 4, 2014; which issued as U.S. Pat. No. 9,048,998 on Jun. 2, 2015, which is a continuation of U.S. patent application Ser. No. 13/922,833, filed Jun. 20, 2013; which issued as U.S. Pat. No. 8,707,129 on Apr. 22, 2014, which is a continuation of U.S. patent application Ser. No. 13/437,343, filed Apr. 2, 2012; which issued as U.S. Pat. No. 8,572,461 on Oct. 29, 2013, which is a continuation of U.S. patent application Ser. No. 12/112,636, filed Apr. 30, 2008; which issued as U.S. Pat. No. 8,171,372 on May 1, 2012, which claims the benefit of U.S. provisional application No. 60/915,040, filed Apr. 30, 2007, the contents of which are hereby incorporated by reference herein.

FIELD OF THE INVENTION

This application is related to wireless communications.

BACKGROUND

A goal of the Third Generation Partnership Project (3GPP) Long Term Evolution (LTE) program is to develop new technology, new architecture and new methods for settings and configurations in wireless communication systems in order to improve spectral efficiency, reduce latency and better utilize the radio resource to bring faster user experiences and richer applications and services to users with lower costs.

Wireless communication systems usually require feedback signaling to enable uplink and downlink communications. For example, hybrid automatic retransmission request (HARQ) enablement requires acknowledge/non-acknowledge (ACK/NACK) feedback. Adaptive modulation and coding (AMC) requires channel quality index (CQI) feedback from a receiver. Multiple Input/Multiple Output (MIMO) systems or precoding requires rank and/or precoding matrix Index (PMI) feedback from a receiver. Typically, this type of feedback signaling is protected by coding and the signaling does not have error checking or detection capabilities. However, efficient signaling is essential to an evolved universal mobile telephone system (UMTS) terrestrial radio access network (E-UTRAN). Adding error check (EC) and error detection capability to the feedback control signaling makes more advanced applications possible. Error check (EC) and error detection capability can enable advanced signaling schemes, enhanced MIMO link performance, reduced system overhead, and increased system capacity.

An example of an application that may require error detection and checking capability for feedback control signaling is the preceding information validation. The precoding information validation is used to inform a WTRU about the precoding information that is used at an e Node B so that the effective channel seen by the WTRU that contains precoding effects can be reconstructed by the WTRU. This is required for accurate data detection for MIMO systems using precoding, beam forming or the like.

A wireless transmit receive unit (WTRU) may feedback a precoding matrix index (PMI) or antenna weight to a base station (BS) or an e Node B (eNB). To inform a WTRU of the precoding matrices used at an eNB, the eNB may send a validation message to the WTRU. Each matrix that the WTRU signals as feedback to the eNB may be denoted by PMI_j1, PMI_j2 . . . PMI_jN, where N is a integer value equal to the total number of matrices. The eNB may send a validation message containing information about N PMIs denoted by PMI_k1, PMI_k2 . . . PMI_kN to the WTRU.

Each PMI may be represented by L bits. The value of L depends upon the multiple input/multiple output (MIMO) antenna configuration and codebook sizes.

Communication resources may be assigned to a WTRU. A resource block (RB) consists of M subcarriers, for example M=12, where M is a positive integer. A resource block group (RBG) or sub-band may include N_RB RBs, where N_RB may equal, for example, 2, 4, 5, 6, 10, 25 or larger. A system bandwidth can have one or more RBGs or sub-bands depending on the size of bandwidth and value of N_RB per RBG or sub-band.

A WTRU may feed back one PMI for each RBG or sub-band that is configured to it. The terms RBG and sub-band may be used interchangeably. N RBGs, where N.ltoreq.N_RBG, can be configured to or selected by a WTRU for feedback and reporting purpose. If N RBGs or sub-bands are configured to or selected by a WTRU, then the WTRU feeds back N PMIs to the eNB. The eNB may send the validation message consisting of N PMIs back to the WTRU.

Let N_PMI be a number of bits that represents a PMI. The total number of bits for the WTRU PMI feedback is N.times.N_PMI. The maximum number of bits for WTRU PMI feedback is N_RBG.times.N_PMI bits per feedback instance. When a straightforward precoding validation scheme is used, the maximum number of bits for PMI validation message is N_RBG.times.N_PMI bits per validation message.

Table 1 shows a number of bits for WTRU PMI feedback and signaling with the assumption that N_PMI=5 bits. The numbers are summarized for 5, 10 and 20 MHz bandwidth. The second row, N_RB, is the number of RBs per RBG or sub-band, which is in a range of 2 to 100 for 20 MHz. The third row, N_RBG per band, is the number of RBGs or sub-bands per 5, 10 or 20 MHz. The value of N_RBG is in a range from one to fifty. The fourth row is the total number of bits used for WTRU PMI feedback signaling per feedback instance. This is for frequency selective precoding feedback or multiple PMI feedback

| | 5 MHz (300 subcarriers) | | | | 10 MHz (600 subcarriers) | | | | | 20 MHz (1200 subcarriers) | | | | |
|---|---|---|---|---|---|---|---|---|---|---|---|---|---|---|
| N_RB per RBG | 2 | 5 | 10 | 25 | 2 | 5 | 10 | 25 | 50 | 2 | 5 | 10 | 25 | 50 | 100 |
| N_RBG per band | 13 | 5 | 3 | 1 | 25 | 10 | 5 | 2 | 1 | 50 | 20 | 10 | 4 | 2 | 1 |
| Max # of bits for PMI feedback per feedback | 65 | 25 | 15 | 5 | 125 | 50 | 25 | 10 | 5 | 250 | 100 | 50 | 20 | 10 | 5 |
| Max # of bits for PMI signaling per message | 65 | 25 | 15 | 5 | 125 | 50 | 25 | 10 | 5 | 250 | 100 | 50 | 20 | 10 | 5 |

Assume 12 subcarriers per RB.
N_RB: Number of resource blocks.
N_RBG: Number of frequency RB groups.
N_PMI: Number of bits to represent a PMI.
Max number of bits for WTRU PMI feedback = N_RBG × N_PMI bits.
Max number of bits for eNB validation message = N_RBG × N_PMI bits.

PMI feedback and PMI validation may require over 250 bits per feedback instance and per validation message as shown in the above table.

Feedback error significantly degrades the link and system performance. It would be desirable for feedback bits to be protected with error checking (e.g., channel coding). Furthermore, knowing whether there is an error in a feedback signal improves system performance such as link performance, because the erroneous feedback information can be avoided. Furthermore, knowing whether there is error in the feedback signaling enables the use of advanced signaling schemes or applications such as the precoding confirmation and indication schemes. Precoding confirmation can be sent to confirm the correctness of feedback signaling if there is no error in the feedback signaling.

A single bit or bit sequence may be used for precoding confirmation and may be sufficient for some applications. The use of advanced signaling such as precoding validation using confirmation significantly reduces the signaling overhead. Therefore error checking and detection is desirable.

SUMMARY

Disclosed is a method and apparatus for feedback type signaling error check, detection, protection and feedback in a wireless communication system. Feedback type signaling may include channel quality index (CQI), precoding matrix index (PMI), rank and/or acknowledge/non-acknowledge (ACK/NACK). The disclosure includes a wireless transmit receive unit (WTRU) performing a method that includes providing a PMI(s), producing error check (EC) bit(s), coding the PMI(s) and the EC bit(s), and transmitting the coded PMI(s) and EC bit(s). The method may be applied to other feedback information, such as CQI, rank, ACK/NACK and the like.

BRIEF DESCRIPTION OF THE DRAWINGS

A more detailed understanding may be had from the following description, given by way of example in conjunction with the accompanying drawings wherein.

DETAILED DESCRIPTION

When referred to hereafter, the terminology "wireless transmit/receive unit (WTRU)" includes but is not limited to a user equipment (UE), a mobile station, a fixed or mobile subscriber unit, a pager, a cellular telephone, a personal digital assistant (PDA), a computer, or any other type of user device capable of operating in a wireless environment. When referred to hereafter, the terminology "base station" includes but is not limited to a Node-B, a site controller, an access point (AP), or any other type of interfacing device capable of operating in a wireless environment.

Figure 1:
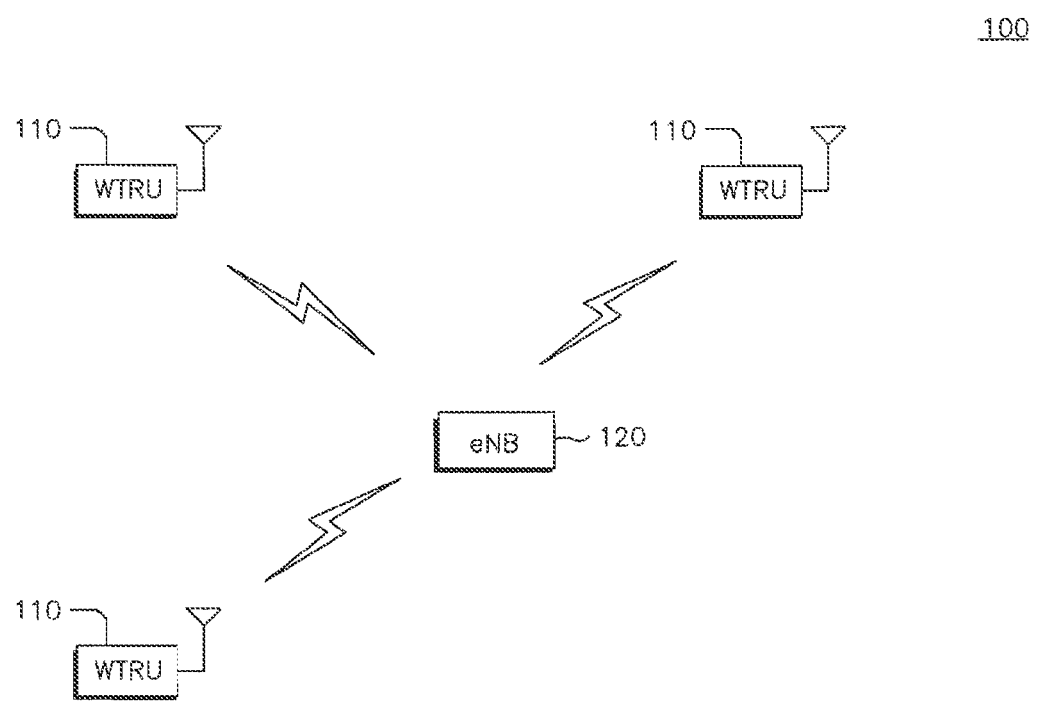
FIG. 1 shows a wireless communication system including a plurality of WTRUs and an eNB.

FIG. 1 shows a wireless communication system 100 including a plurality of WTRUs 110 and an eNB 120. As shown in FIG. 1, the WTRUs 110 are in communication with the eNB 120. Although three WTRUs 110 and one eNB 120 are shown in FIG. 1, it should be noted that any combination of wireless and wired devices may be included in the wireless communication system 100.

Figure 2:
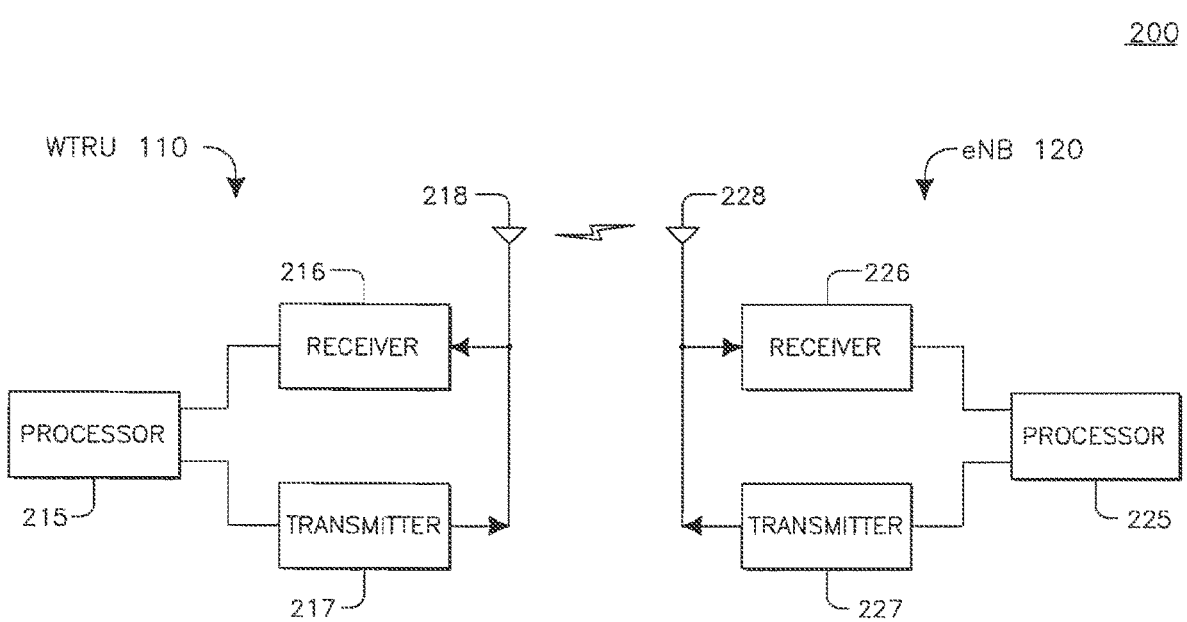
FIG. 2 is a functional block diagram of the WTRU and the eNB of the wireless communication system of FIG. 1.

FIG. 2 is a functional block diagram 200 of the WTRU 110 and the eNB 120 of the wireless communication system 100 of FIG. 1. As shown in FIG. 2, the WTRU 110 is in communication with the eNB 120. The WTRU 110 is configured to transmit feedback signals and control signals to the eNB 120. The WTRU is also configured to receive and transmit feedback and control signals from and to the eNB. Both the eNB and the WTRU are configured to process signals that are modulated and coded.

In addition to the components that may be found in a typical WTRU, the WTRU 110 includes a processor 215, a receiver 216, a transmitter 217, and an antenna 218. The receiver 216 and the transmitter 217 are in communication with the processor 215. The antenna 218 is in communication with both the receiver 216 and the transmitter 217 to facilitate the transmission and reception of wireless data.

In addition to the components that may be found in a typical eNB, the eNB 120 includes a processor 225, a receiver 226, a transmitter 227, and an antenna 228. The receiver 226 and the transmitter 227 are in communication with the processor 225. The antenna 228 is in communication with both the receiver 226 and the transmitter 227 to facilitate the transmission and reception of wireless data.

A WTRU may transmit a feedback signal (e.g., PMI feedback) to an eNB. Error check (EC) (e.g., Cyclic Redundancy Check (CRC)) bits may be attached to the feedback signal (e.g., PMI feedback). Both the feedback signal (e.g., PMI) and the EC bits may be encoded prior to transmission. The feedback signal may include PMI, CQI, rank, ACK/NACK or other type feedback signal. While this disclosure makes reference to a PMI bit, CQI bit, EC bit and the like, one skilled in the art may recognize that PMI feedback, CQI feedback and error checking and correction may be, and in most cases is multiple bits. Although feedback signals such as PMI or CQI are used as examples other type feedback signals may also be used.

Different type channels may be used for transmitting and carrying the feedback type signal. For example, both control type channels and data type channels may be used to carry the feedback type signal. An example of a control type channel is the physical uplink control channel (PUCCH). An example of a data type channel is the physical uplink shared channel (PUSCH). However, one skilled in art will recognize that the method and apparatus disclosed herein are independent of channel choice.

The PMI and EC bits may be coded together, with or without data bits. Both data type channels and control type channels may be used to transmit the feedback signal and EC bits. For example a data type channel (e.g., the physical uplink shared channel (PUSCH)) may be used to transmit PMI and EC bits. A control type channel (e.g., the physical uplink control channel (PUCCH)) may also be used to transmit PMI and EC bits.

Alternatively, PMI and EC bits may be coded with a first coding scheme and data bits may be coded with a second coding scheme. Each of the coding schemes may be different. For example, convolutional coding or Reed-Muller coding may be used for the feedback type signal and turbo coding is used for the data type signal. Alternatively, the coding schemes may be the same, but with different parameters and settings to address different error rate requirements for feedback type signal and data type signal. The data type channel (e.g., PUSCH) may be used to transmit PMI and EC bits. The control type channel (e.g., PUCCH) may also be used to transmit PMI and EC bits.

PMI and EC bits may be separately coded for each group, if grouping is used for feedback type signaling.

All the PMI and/or EC bits may be fed back or reported at the same time. For example, all the PMI and/or EC bits may be reported in a same transmission time interval (TTI). Alternatively, the feedback type bits and the error checking bits may be reported at a different time. For example, PMI and/or EC bits may be split into groups and reported in different TTIs.

Error checking and detection methods such as cyclic redundancy check (CRC), for example, may be used. If CRC is used, it may be, for example, 24-bit CRC or 16-bit CRC. The length of the CRC may be varied, and the actual length used may depend on design choices.

CRC bits may be attached to feedback type signals and transmitted on a data type channel to carry the feedback type signal bits and CRC bits. The feedback type signals may be, for example, PMI, CQI, rank or ACK/NACK. The data type channel may be, for example, a PUSCH. A data type channel has a large capacity and can accommodate a relatively large number of bits. Therefore, the CRC can be, for example, 24-bit CRC, 16-bit CRC or some other length CRC. Long CRC may be used, and is preferable as it provides for better error checking. While this may add additional overhead due to the addition of CRC bits, the PUSCH may have the capacity to handle the larger number of bits. Using a data channel, such as PUSCH, allows for the transmission of feedback signals such as PMI, CQI, rank and ACK/NACK in a single TTI. Therefore, a feedback type signal with a long CRC that provides better error check capability can be implemented.

Alternatively, CRC bits may be attached to feedback type signals and transmitted on a control type channel. The CRC can be a 24-bit CRC, 16-bit CRC or other length CRC. Typically, control type channels may not have large capacity to carry a large number of bits. In order to transmit CRC bits and the feedback type signals, the transmission may be split and transmitted multiple times. The PMI feedback signal may be split, and transmitted in multiple TTIs. For example, one PMI may be transmitted in each TTI until all the feedback signals are transmitted. CQI or other feedback signals can be handled in a similar way.

PMI, CQI and/or other feedback type signals can be transmitted separately at different times or in different TTIs. In general, a control type channel (e.g. PUCCH) may not carry large number of bits each time and if there are large number of feedback bits needed to be sent, the feedback bits can be divided or split into groups. Each group may be reported, one at a time. Each feedback instance may contain a single PMI, CQI, other feedback signal, or combination of feedback signals. The CRC can be fed back or transmitted at the same time (in the same TTI) as PMI, CQI or other feedback signals. Alternatively, the CRC can be fed back or transmitted separately from PMI, CQI or other feedback signals. That is, CRC can be transmitted at different times or in different TTIs from the times or TTIs that the PMI, CQI or other feedback signals are transmitted. CRC can also be divided into segments or groups, and each CRC segment may be transmitted or fed back with feedback signal at the same time or in the same TI as the times or TTIs that the PMI, CQI or other feedback signal are transmitted. Each CRC segment can also be transmitted at different time or different TTI from the times or TTIs that the PMI, CQI or other feedback signal are transmitted.

Error checking or detection schemes may be used for different types of channels that transmits feedback signal. One error checking scheme (e.g., 24-bit or 16-bit CRC) may be used on a feedback type signal that is transmitted on a data type channel while another error checking scheme (single bit parity check, 5-bit or 16-bit CRC) may be used on feedback type signal transmitted on a control type channel.

In addition, error checking or detection schemes may be used for different type of feedback signals. One error checking scheme (24-bit or 16-bit CRC) may be used on one type of feedback signal (PMI) while another type of error check scheme (single bit parity check, 5-bit or 16-bit CRC) may be used on another type of feedback signal (CQI).

Many combinations error checking and detection schemes used for different types of feedback signals and/or for different types of channels that transmit different feedback signals are possible. For example, one error checking scheme may be used on one type feedback signal (PMI) transmitted on one type of channel (data type channel such as PUSCH). Another error checking scheme may be used on one type of feedback signal (PMI) transmitted on another type of channel (control type channel, such as PUCCH). Another error checking scheme may be used on another type of feedback signal (CQI) transmitted on one type of channel (data type channel such as PUSCH). Another error checking scheme may be used on another type of feedback signal (CQI) transmitted on another type channel (control type channel such as PUCCH).

Furthermore, error checking or detection schemes may be used for different groups of feedback signals. To emphasize a difference in importance of groups of feedback signals, a strong error checking scheme may be used for the most important feedback group, a moderate error checking scheme may be used for a feedback group of medium importance, and the least strong error checking scheme may be used for the least important feedback group. This can also be combined with different or same type feedback signals transmitted on different or same type channels as described previously.

Use of CRC attached to the feedback signal can apply to a single feedback signal such as one PMI and/or one CQI. Such single feedback scheme may be used when non-frequency selective feedback or wideband feedback (one feedback per entire bandwidth or per entire configured bandwidth) is used.

Other error check or detection methods such as parity check (including a single-bit parity check) or a block parity check, for example, may also be used. If the overhead needs to be minimized, a single bit parity check or short CRC such as 5-bit CRC may be used and attached to the feedback signal. The disclosure herein is not limited to any one particular error checking scheme, as would be recognized by one skilled in the art.

Coding schemes such as convolutional coding, Reed-Solomon or Reed-Muller coding, for example, may be used. Other coding schemes, for example, turbo coding and low density parity check (LDPC) code, may also be used. If the feedback is transmitted via a data type channel (e.g., physical uplink shared channel (PUSCH)), convolutional or block coding may be suitable because the data type channel (e.g., PUSCH) allows transmission of a large number of bits. Reed-Muller or Reed-Solomon coding also may be suitable due to a moderate number of bits being coded by these coding schemes. If the feedback is transmitted via a control type channel (physical uplink control channel (PUCCH)), Reed-Muller or Reed-Solomon coding may be suitable because the control type channel (PUCCH) may not allow transmission of a large number of bits. The disclosure herein is not limited to any one particular coding scheme, as would be recognized by one skilled in the art.

Figure 3:
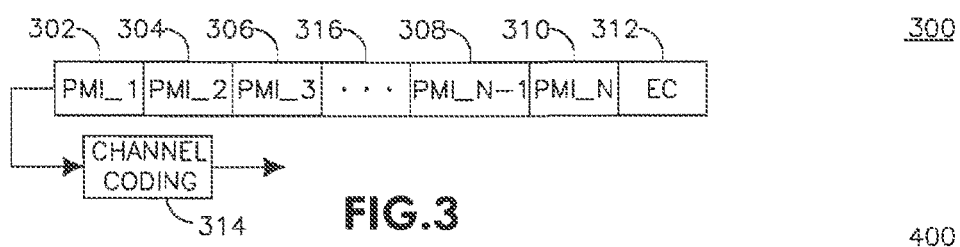
FIG. 3 is a block diagram of PMI feedback with error checking and correction in accordance with one embodiment.

FIG. 3 is a block diagram 300 of PMI feedback with error checking and correction in accordance with one embodiment. Multiple PMIs configured as PMI_1 302, PMI_2 304, PMI_3 306 through PMI_N−1 308 and PMI_N 310 are shown in FIG. 3. EC bits 312 are attached to the PMI signal 316. The EC bits 312 could be CRC bits of 24 bit length, 20 bit length or 16 bit length. Other lengths of CRC may also be used. PMI bits (302-310) and the EC bits 312 are encoded by a channel coding function 314 prior to transmission. The channel coding can be performed jointly for all PMIs and EC. The jointly encoded PMIs and EC can be transmitted at the same time or in the same TTI. The jointly encoded PMIs and EC can be transmitted at a different time or in different TTIs. Alternatively the channel coding can be performed separately for each PMI and the EC bits or for a group of PMIs and EC. The EC bits can be divided into segments and each EC bit segment can be separately channel encoded and transmitted.

For example if there are an integer number "N" PMIs, each PMI may be 4 bits and each EC may be 24 bits, using, for example, 24 bit CRC. The total number of bits is 4N+24 bits. The total number of bits can be jointly encoded using channel coding (e.g., Reed-Muller coding or convolutional coding). The encoded bits can be transmitted or fed back at one time in a single TTI. The total number of encoded bits can also be transmitted or fed back at several different time, or different TTIs. For example, the encoded bits may be transmitted an integer number "M" times in M different TTIs. Each TTI may transmit (4N+24)/M original information and CRC bits. The (4N+24)/M original information and CRC bits in each TTI may contain PMI bits and/or CRC bits. If the TTI contains a combination of PMI and CRC bits, then 4N/M PMI bits and 24/M CRC bits may be included in a single TTI. If M=N, 4 PMI bits and a fractional portion of the CRC bits may be transmitted in a single TTI.

Alternatively, a 24 bit CRC can be divided into 6 segments, each with 4 bits, which is the same number of bits as in a PMI. Each PMI and each CRC segment may be separately or jointly encoded and transmitted separately or jointly in a TTI.

The EC bits 312 can be a CRC, for example. The channel coding function 314 can be convolution coding, for example. Error checking and detection methods, such as a parity check, can also be used, and other channel coding methods, such as Reed-Muller coding or Reed-Solomon coding, for example, can also be used.

Each PMI may represent precoding information for a sub-band, an RBG, a group of sub-bands or a wideband. For example, PMI_1 can be a wideband PMI ("average" precoding information for a whole band) and PMI_2 to PMI_N can be sub-band PMIs or averaged PMIs, each corresponding to a precoding information for a sub-band, and RBG, or a group of sub-bands.

Similarly CQI and other feedback type signals can be added with error check capability by attaching CRC, channel coded and transmitted as described previously.

PMI feedback signaling may be combined into groups with separate error checking for each group of PMIs. EC bits may be attached to each group of PMIs before channel coding. Different EC schemes may be used for different group of PMIs to emphasize the different importance of PMI groups.

Figure 4:
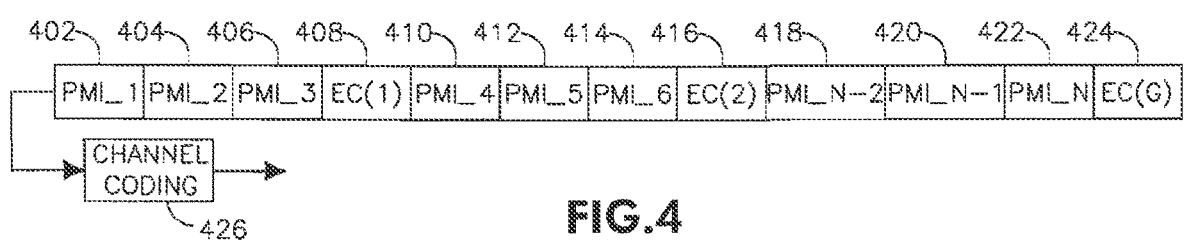
FIG. 4 is a block diagram of PMI feedback with error checking and correction in accordance with another embodiment.

FIG. 4 is a block diagram 400 of PMI feedback with error checking and correction in accordance with another embodiment, where PMI_1 402, PMI_2 404 and PMI_3 406 are grouped together and a first error check EC(1) 408 is attached. PMI_4 410, PMI_5 412 and PMI_6 414 are grouped together and are attached with EC(2) 416. PMI_N−2 418, PMI_N−1 420 and PMI_N 422 are grouped together and are attached with EC(G) 424. PMI (402-406, 410-414, 418-422) and EC 408, 416, 424 are coded by channel coding function 426.

As state above, the EC could be a CRC. An error checking, detection and correction method may be selected based on a total number of bits that are encoded. The EC may use, for example, a short or long CRC, a single parity bit or a block parity check bit. Other error checking, correction and detection methods, such as advanced parity checking, for example, may be used. Different or same EC schemes may be used for different group of PMIs to emphasize the different importance of PMI groups. Some ECs may use long CRC, some may use short CRC and some use other EC schemes (e.g., single bit parity check). For example EC(1) may be a 24-bit CRC while EC(2) may be a 16-bit CRC and EC(G) may be a 5-bit CRC. Any combination of EC schemes for PMI groups is possible.

The channel coding function may use, for example, convolutional coding or Reed-Solomon coding. Other channel coding methods, such as block coding, turbo coding or LDPC, for example, may also be used.

PMIs can be divided into several groups and groups of PMIs can be transmitted in different transmission time intervals (TTI). Groups of PMIs may also be transmitted in a single TTI. Each group may be reported after channel coding. This is referred to as frequency selective feedback and reporting of multiple PMIs. CQI, rank and ACK/NACK signals may also be fed back or reported on a frequency selective basis.

PMI_1 402, PMI_2 404, PMI_3 406 and EC(1) 408 may be reported in a single TTI, for example TTI(1). PMI_4 410, PMI_5 412, PMI_6 414 and EC(2) 416 may be reported in a second TTI, for example TTI(2). PMI_N−2 418, PMI_N−1 420, PMI_N 422 and EC(G) 424 may be reported in another TTI, for example TTI(G).

If the error detection or checking mechanism is disabled or if the error detection or checking capability is removed, there is no EC bit attachment. In that case, PMI group 1 (PMI_1 402, PMI_2 404, PMI_3 406) may be reported in TTI(1), PMI group 2 (PMI_4 410, PMI_5 412, PMI_6 414) may be reported in TTI(2) and PMI group G (PMI_N−2 418, PMI_N−1 420, PMI_N 422) may be reported in TTI(G). The reporting may occur with or without EC bits.

Figure 5:
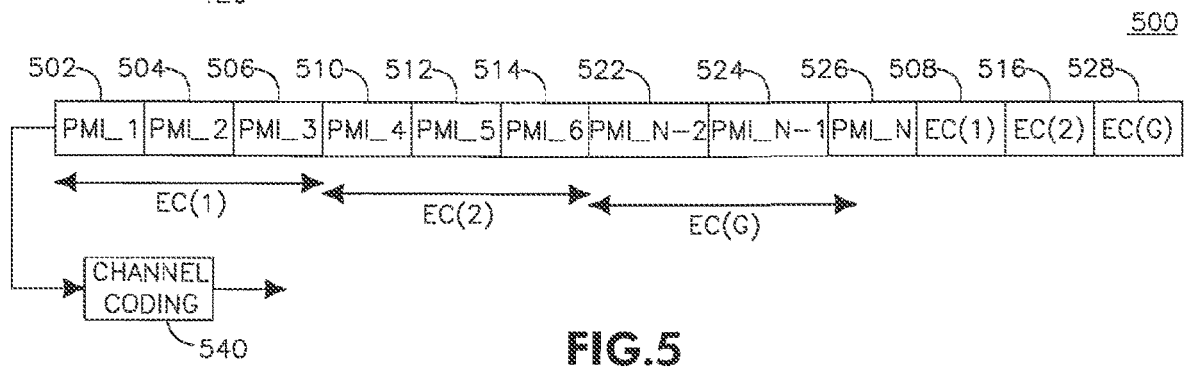
FIG. 5 is a block diagram of PMI feedback with error checking and correction in accordance with an alternative embodiment.

FIG. 5 is a block diagram of PMI feedback with error check and correction in accordance with an alternative embodiment. The error check bits EC(1) 508 are used for PMI_1 502, PMI_2 504 and PMI_3 506. The error check bits EC(2) 516 are used for PMI_4 510, PMI_5 512 and PMI_6 514 and the error check bits EC(G) 528 are used for PMI_N−2 522, PMI_N−1 524 and PMI_N 526. The PMI bits and the EC bits are coded by channel coding function 540 prior to transmission.

In another alternative embodiment, the PMIs may be separated into groups, and each group has an associated error detection and check value. The feedback signaling and error check of each group are coded separately. The coded feedback bits and EC bits can be transmitted in the same TTI or in different TTIs. Each PMI group, with its associated EC, is coded individually.

Figure 6:
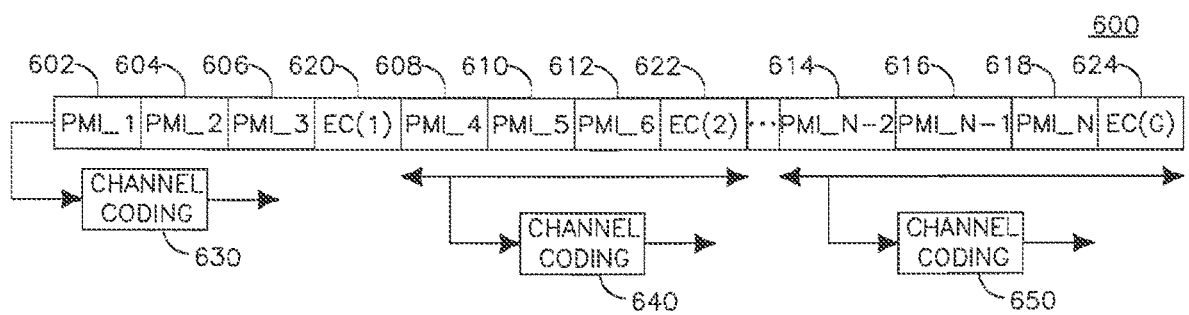
FIG. 6 is a block diagram of PMI feedback with error checking and correction in accordance with another alternative embodiment.

FIG. 6 is a block diagram 600 of PMI feedback with error check and correction in accordance with the other alternative embodiment. PMIs are divided into G groups for error detection and/or correction. EC(1) 620 is attached to PMI_1 602, PMI_2 604 and PMI_3 606, EC(2) 622 is attached to PMI_4 608, PMI_5 610 and PMI_6 612 and EC(N) 624 is attached to PMI_N−2 614, PMI_N−1 616 and PMI_N 618. PMI_1 602, PMI_2 604 and PMI_3 606 and EC (1) 620 are encoded by a first channel coding function 630. PMI_4 612, PMI_5 614 and PMI_6 616, along with EC(2) 622 are encoded by second channel coding function 640. PMI_N−2 614, PMI_N−1 616 and PMI_N 618, along with EC(G) 824 are encoded by an Gth channel coding function 650. Error checking, correction and detection methods may be chosen based on the number of bits requiring encoding.

The EC may use, for example, a CRC that may be, for example, 24 bits, 20 bits or 16 bits. The EC may also use a single parity bit or block parity check bits that have fewer bits than 16 bits. The EC may also use, for example, error checking and detection methods such as advanced parity check.

The channel coding functions 630, 640, 650 may use, for example, convolutional coding or Reed-Solomon coding. Other appropriate channel coding such as block coding, turbo coding or LDPC may also be used.

The EC bits can be divided into several groups, each group of EC bits can be fed back or reported at the same time or at different time. For example each group of EC bits can be fed back or reported in the same or different TTIs. Each group is reported after joint or separate channel coding for each group.

Each PMI group can be reported in a different TTI or together in the same TTI. Each group is reported after separate channel coding of groups. Also, other feedback signaling, such as CQI, rank, and ACK/NACK, for example, may be used.

PMI_1 602, PMI_2 604, PMI_3 606 and EC(1) 620 may be reported in TTI(1). PMI_4, PMI_5, PMI_6 and EC(2) may be reported in TTI(2), and PMI_N−2, PMI_N−1, PMI_N and EC(G) may be reported in TTI say TTI(G).

If the error detection or check mechanism is disabled or if error detection or check capability is removed, there may be no EC bits attachment. The PMI groups may then be reported without the EC bits. PMI group 1 (PMI_1 402, PMI_2 404, PMI_3 406) may be reported in a TTI(1), PMI group 2 (PMI_4 410, PMI_5 412, PMI_6 414) may be reported in TTI(2) and PMI group G (PMI_N−2 418, PMI_N−1 420, PMI_N 422) may be reported in TTI(G). Each reporting group may have separate channel coding.

When the number of PMI groups is equal to the number of PMIs (G=N), then there is one PMI per each PMI group. Each PMI may be attached with EC (e.g., CRC) bits and encoded separately. Each PMI may be reported at different times. PMI_1 702, PMI_2 704 and PMI_N 706 may be reported in different TTIs. For example, PMI_1 702 may be reported in TTI(1), PMI_2 704 in TTI(2) and PMI_N 706 in TTI(N.). The feedback or reporting may occur via a control type channel (e.g., physical uplink control channel (PUCCH)).

Alternatively, PMI_1 704, PMI_2 70, PMI_N 706 may be reported at the same time. For example PMI_1 704 to PMI_N 706 may be reported in a single TTI. This may occur via the data type channel (e.g., PUSCH), due the ability of the data type channel (e.g., PUSCH) to handle more bits.

Other feedback signals, such as CQI, rank, and ACK/NACK, for example, may be used with or instead of PMI.

Figure 7:
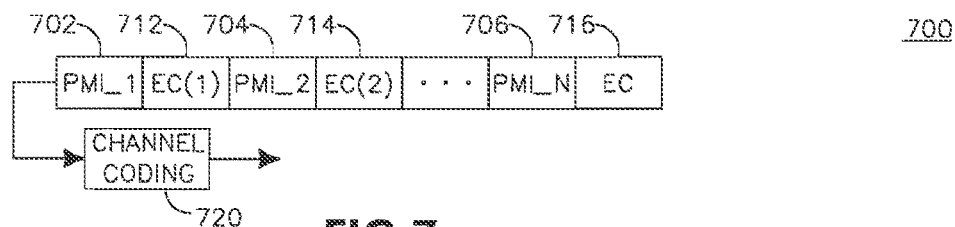
FIG. 7 is a block diagram of PMI feedback with error checking and correction in accordance with yet another alternative embodiment.

FIG. 7 is a block diagram of PMI feedback with error checking and correction in accordance with yet another alternative embodiment. PMIs are divided into G groups for error check and detection, with G=N. PMI_1 702 is attached with error check bits EC(1) 712, PMI_2 704 is attached with EC(2) 714 and PMI_N 706 are attached with EC(N) 716. Each PMI/EC pair is encoded by the channel coding function 720. Appropriate error checking, correction and error detection schemes may be used, and may depend on the number of bits required to be encoded. For example, a particular EC may use a CRC, for example, 24-bit CRC, short CRC, a single parity bit or block parity check bits. Channel coding may use Reed-Solomon coding, for example. Other appropriate error check and detection such as long CRC or other parity check schemes may be used. Other appropriate channel coding such as block coding, convolutional coding, turbo coding or LDPC may also be used.

Using frequency selective reporting, PMI_1 702 may be reported in TTI(1), PMI_2 704 in TTI(2) and PMI_N 706 in TTI(N). These PMIs may be reported via the control type channel (e.g., PUCCH). Alternatively, PMI_1 to PMI_N can be reported in a single TTI via the data type channel (e.g., PUSCH). Other feedback signaling, such as CQI, rank and ACK/NACK, for example, may be used.

Figure 8:
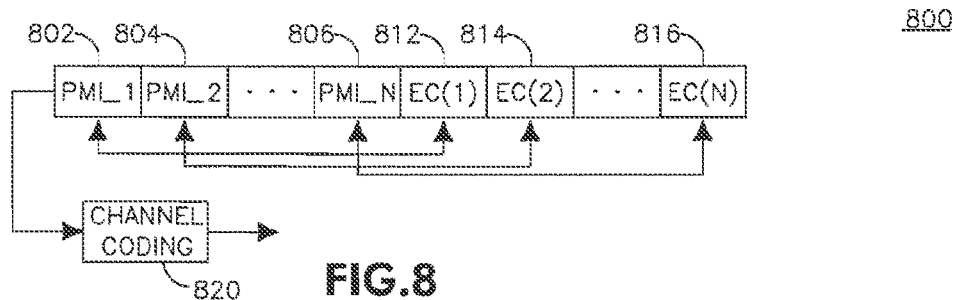
FIG. 8 is a block diagram of PMI feedback with error checking and correction in accordance with yet another alternative embodiment.

FIG. 8 is a block diagram of PMI feedback with error checking and correction in accordance with yet another alternative embodiment. EC(1) 812 may be used for PMI_1 802, EC(2) 814 may be used for PMI_2 (804) and EC(N) 816 may be used for PMI_N (806). PMIs and ECs are coded either separately or jointly in the channel coding function 820.

PMI_1 802 may be reported in TTI(1), PMI_2 804 may be reported in TTI(2) and PMI(N) 806 may be reported in TTI(N). PMI_1 802, PMI_2 804 and PMI_N 806 can be separately coded and reported in different or the same TTIs. Alternatively PMI_1 802 PMI_2 804, and PMI_N 806 can be jointly coded, split, and reported in different TTIs. Furthermore PMI_1 802, PMI_2 804 and PMI_N 806 can be jointly coded and reported in the same TTI. Alternatively, PMI_1 802, PMI_2 804 and PMI_N 806 can be separately coded with different protection schemes and reported in the same TTI. CQI, rank and ACK/NACK may be used as well.

FIGS. 3 to 8 depict error checking, coding and feedback for PMI, and show a single type feedback signal. CQI and other type feedback signals can be substituted for PMI.

FIGS. 9 through 12 depict error checking, coding, transmission and feedback for more than one type feedback signal. FIGS. 9 through 12 are discussed in detail below.

PMI feedback and other type control signaling may be error checked separately with the same or different error checking and then encoded together. For example, a first type feedback signal, which may be a PMI, can be attached with a first EC, which may be a CRC, such as a 24 bit CRC. A second type feedback signal, which may be a CQI, may be attached with the same EC.

In another example, a first type feedback signal, which may be a PMI, may be attached with an EC, which may be a CRC, such as a 24 bit CRC. A second type feedback signal may be attached with a second EC, may be a 16 bit CRC.

In general, different error checking and/or correction can be used for different types feedback signals or different feedback signals of the same type. The choice of which error checking and/or correction to use may involve a design decision of robustness versus overhead. A longer CRC may give greater protection, but it also creates more bits. Therefore, if one type feedback signal is more important than another type feedback signal, a stronger error checking and/or correction capability can be provided to the more important type feedback signal. Similarly for the feedback signal of the same type if one feedback signal or group of feedback signals is more important than another feedback signal or group of feedback signals, a stronger error checking and/or correction capability can be provided to the more important feedback signal or group of feedback signals.

Referring again to the examples provided above, if the first feedback signal, which may be PMI, is more important than the second feedback signal, which may be a CQI, then a longer CRC with higher error check and detection ability can be used for PMI and shorter CRC with lower error check and detection ability can be used for CQI. Applying different error checking and/or correction capabilities to feedback signals can protect the feedback signal that are of importance, optimize the link performance and minimize the signaling overhead.

Figure 9:
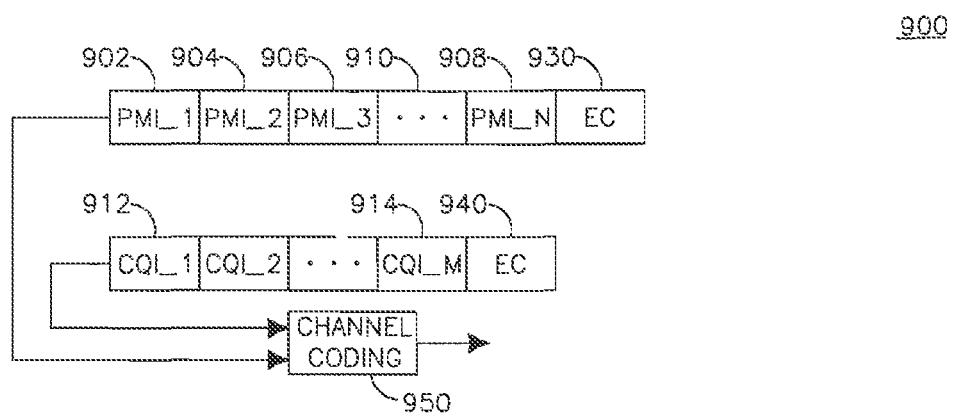
FIG. 9 is a block diagram of PMI and CQI feedback with error checking and correction in accordance with yet another alternative embodiment.

FIG. 9 is a block diagram 900 of PMI feedback with error checking and correction and channel quality index (CQI) feedback with error checking and correction in accordance with yet another alternative embodiment. A first EC 930 (e.g., CRC) is attached to PMI_1, 902 PMI_2 904, PMI_3 906 through PMI_N 908. A second EC 940 (e.g., CRC) is attached to CQI-1 912 through CQI-M 914. The EC attached PMI signal 910 and the CQI signal 920 are coded together in the channel coding function 950 to produce a single transmit signal.

In FIG. 9 the first EC 930 and the second EC 940 may be the same. This would give equal error checking and protection to each feedback signal.

Alternatively, the first EC 930 and the second EC 940 may be different. If the PMI feedback is more important to system performance than the CQI feedback, the first EC 930 may be more robust. For example, the first EC may be a 24-bit CRC and the second EC may be a 16-bit CRC.

PMI feedback signals can consist of a "wideband" PMI, "narrowband" PMI, "sub-band" PMI, and/or averaged PMI. Similarly CQI feedback signals can consists of a "wideband" CQI, "narrowband" CQI, "sub-band" CQI and/or averaged CQI.

Also, similar to the embodiments including a single feedback, as shown in FIG. 3 through FIG. 8, the EC bits and the feedback bits may be transmitted in a single TTI, or may be split in to multiple TTIs. More specifically, the data type channels (e.g., PUSCH) may be used to transmit the feedback bits and the EC bits in a single TTI, as the data type channel is able to handle a greater number of bits per TTI.

Also, the coding used for the feedback bits and the EC bits may be the same with the same or different weights, or may be different. One skilled in the art would recognize that there numerous possible combinations of coding, transmitting, and error checking.

Figure 10:
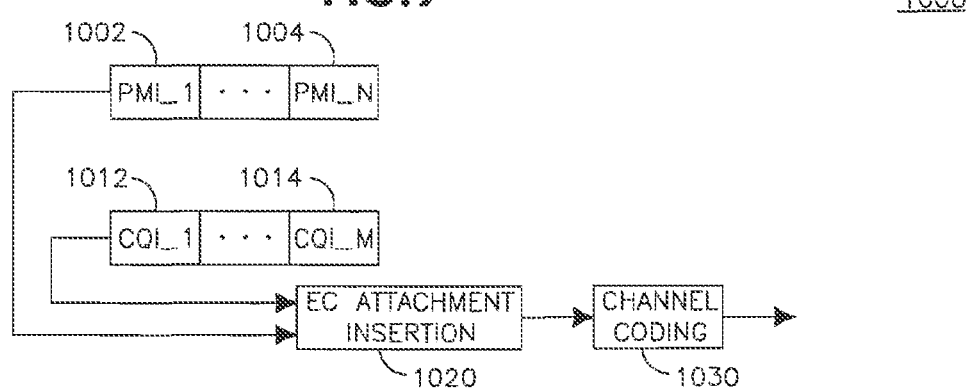
FIG. 10 is a block diagram of PMI and CQI feedback with error checking and correction in accordance with yet another alternative embodiment.

FIG. 10 is a block diagram 1000 of PMI and CQI feedback in accordance with yet another embodiment. The feedback signals may be attached with error check bits together and coded together. Signals that include PMI_1 1002 through PMI_N 1004 are input into an EC attachment/insertion function 1020 along with signals that include CQI_1 1012 through CQI_M 1014. The signals are processed by the EC function 1020 and a single output signal is input into a channel coding function 1030 prior to transmission.

Control signaling other than CQI may be used as well, including rank and ACK/NACK.

Figure 11:
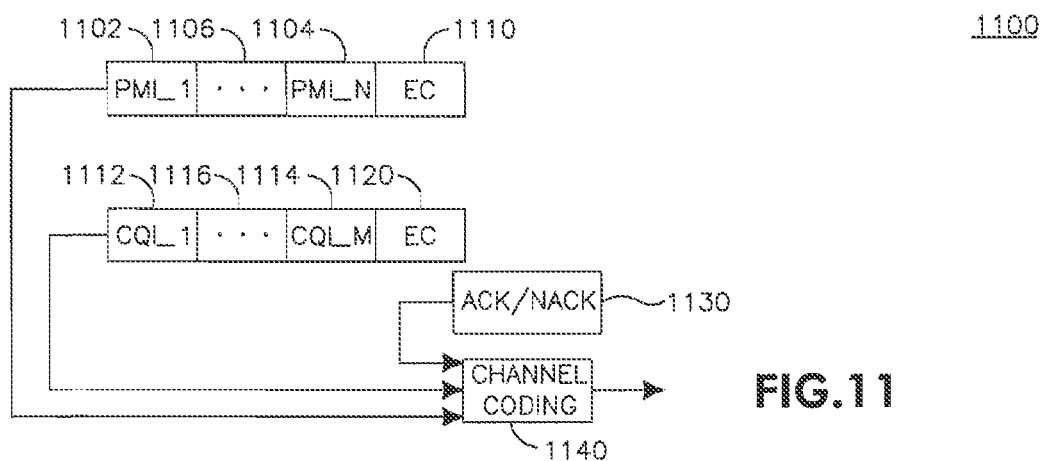
FIG. 11 is a block diagram of PMI, CQI and ACK/NACK feedback with error checking and correction in accordance with yet another embodiment.

FIG. 11 is a block diagram 1100 of PMI feedback with error checking and correction, CQI feedback with error checking and correction and ACK/NACK feedback in accordance with yet another embodiment. A first EC 1110 is attached to PMI_1 1102 through PMI_N 1104. A second EC 1120 is attached to CQI_1 1112 through CQI_M 1114. The PMI signal 1106 and the CQI signal 1116 are input into a channel coding function 1140 with an ACK/NACK signal 1130.

Figure 12:
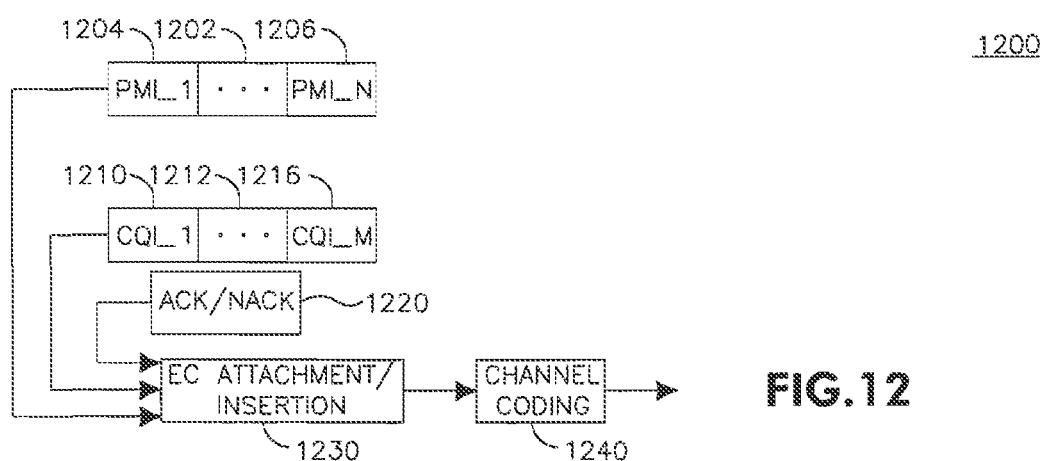
FIG. 12 is a block diagram of PMI, CQI and ACK/NACK feedback with error checking and correction in accordance with yet another embodiment.

ACK/NACK feedback signal 1130 can be replaced with rank feedback signal in FIG. 12. Alternatively rank feedback signal can be added to FIG. 12.

FIG. 12 is a block diagram 1200 of PMI feedback and CQI feedback with ACK/NACK feedback in accordance with yet another embodiment. CQI, PMI and ACK/NACK may be coded together, but error checked separately. A PMI signal 1202 including PMI_1 1204 through PMI_N 1206, a CQI signal 1212 including CQI_1 1214 through CQI_M 1216 and an ACK/NACK signal 1220 are input into an EC attachment/insertion function 1230. The single signal output is processed by a channel coding function 1240 and transmitted. One EC (e.g., CRC) is attached to the combined signal prior to coding and transmission.

ACK/NACK feedback signal 1220 can be replaced with rank feedback signal in FIG. 12. Alternatively rank feedback signal can be added to FIG. 12.

The PMI, CQI and ACK/NACK signals may have different error checking and/or protection. For example PMI may have the highest error checking and/or error protection, while CQI may have lower error checking and/or error protection. PMI, CQI, and ACK/NACK can have different error checking and/or protection while using different error checking and/or coding schemes or using the same error checking and/or coding scheme. Different weights may be used on PMI, CQI and ACK/NACK signals. The different error checking and/or error protection may be achieved by using different error checking and/or coding schemes, or using the same error checking and/or coding scheme but with different importance weights on different feedback type signals by using unequal error checking and/or coding and protection schemes. This may be applicable to other feedback signaling, such as rank, for example.

Similarly PMI feedback signals can consist of a "wideband" PMI, "narrowband" PMI, "sub-band" PMI and/or averaged PMI. Similarly CQI feedback signals can consists of a "wideband" CQI, "narrowband" CQI, "sub-band" CQI and/or averaged CQI.

Although features and elements are described above in particular combinations, each feature or element can be used alone without the other features and elements or in various combinations with or without other features and elements. The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a wireless transmit receive unit (WTRU), user equipment (UE), terminal, base station, radio network controller (RNC), or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) or Ultra Wide Band (UWB) module.

What is claimed is:

1. A method implemented in a wireless transmit receive unit (WTRU), the method comprising:
   the WTRU generating a plurality of feedback bits;
   the WTRU attaching a first set of cyclic redundancy check (CRC) bits to a first subset of feedback bits comprised in the plurality of feedback bits;
   the WTRU performing channel coding on the first subset of feedback bits and the first set of CRC bits;
   the WTRU attaching a second set of CRC bits to a second subset of feedback bits comprised in the plurality of feedback bits;
   the WTRU performing channel coding on the second subset of feedback bits and the second set of CRC bits: and
   the WTRU sending a transmission comprising the channel coded first subset of feedback bits and first set of CRC bits and the channel coded second subset of feedback bits and second set of CRC bits.

2. The method as in claim 1, wherein the plurality of feedback bits comprises one or more of a precoding matrix index (PMI), a channel quality index (CQI), or hybrid automatic repeat request (HARQ) feedback.

3. The method as in claim 1, wherein the transmission is sent on a physical uplink control channel (PUCCH).

4. The method as in claim 1, wherein the transmission is sent on a physical uplink shared channel (PUSCH).

5. The method as in claim 1, further comprising:
   the WTRU selecting the number of CRC bits in the first set of CRC bits based on the number of bits included in the first subset of feedback bits.

6. The method as in claim 5, further comprising:
   the WTRU selecting a channel coding scheme to be used for performing channel coding on the first subset of feedback bits and the first set of CRC bits based on the number of bits included in the first subset of feedback bits.

7. The method as in claim 5, wherein the number of CRC bits in the first set of CRC bits is selected to be 16 bits or 24 bits.

8. The method as in claim 1, further comprising:
   the WTRU generating a second plurality of feedback bits;
   the WTRU determining to not attach any CRC bits to the second plurality of feedback bits;
   the WTRU applying a block code to the second plurality of feedback bits; and
   the WTRU sending a second transmission comprising the block coded second plurality of feedback bits.

9. The method as in claim 1, wherein the plurality of feedback bits comprises feedback for different subbands of a WTRU communication bandwidth.

10. A wireless transmit receive unit (WTRU), the WTRU comprising a processor configured to:
 generate a plurality of feedback bits;
 attach a first set of CRC bits to a first subset of feedback bits comprised in the plurality of feedback bits;
 perform channel coding on the first subset of feedback bits and the first set of CRC bits;
 attach a second set of CRC bits to a second subset of feedback bits comprised in the plurality of feedback bits;
 perform channel coding on the second subset of feedback bits and the second set of CRC bits; and
 send a transmission comprising the channel coded first subset of feedback bits and first set of CRC bits and the channel coded second subset of feedback bits and second set of CRC bits.

11. The WTRU as in claim 10, wherein the plurality of feedback bits comprises one or more of a precoding matrix index (PMI), a channel quality index (CQI), or hybrid automatic repeat request (HARQ) feedback.

12. The WTRU as in claim 10, wherein the transmission is sent on a physical uplink control channel (PUCCH).

13. The WTRU as in claim 10, wherein the transmission is sent on a physical uplink shared channel (PUSCH).

14. The WTRU as in claim 10, further comprising:
 the WTRU selecting the number of CRC bits in the first set of CRC bits based on the number of bits included in the first subset of feedback bits.

15. The WTRU as in claim 14, further comprising:
 the WTRU selecting a channel coding scheme to be used for performing channel coding on the first subset of feedback bits and the first set of CRC bits based on the number of bits included in the first subset of feedback bits.

16. The WTRU as in claim 14, wherein the number of CRC bits in the first set of CRC bits is selected to be 16 bits or 24 bits.

17. The WTRU as in claim 10, further comprising:
 the WTRU generating a second plurality of feedback bits;
 the WTRU determining to not attach any CRC bits to the second plurality of feedback bits;
 the WTRU applying a block code to the second plurality of feedback bits; and
 the WTRU sending a second transmission comprising the block coded second plurality of feedback bits.

18. The WTRU as in claim 10, wherein the plurality of feedback bits comprises feedback for different subbands of a WTRU communication bandwidth.

19. A network node, the network node comprising a processor configured to:
 receive a transmission from a wireless transmit receive unit (WTRU), the transmission comprising a channel coded first subset of feedback bits and first set of cyclic redundancy check (CRC) bits and a channel coded second subset of feedback bits and second set of CRC bits;
 decode the channel coded first subset of feedback bits and first set of CRC bits;
 check for errors in the first subset of feedback bits using the first set of CRC bits;
 decode the channel coded second subset of feedback bits and second set of CRC bits; and
 check for errors in the second subset of feedback bits using the second set of CRC bits.

20. The network node of claim 19, wherein the processor is further configured to:
 receive a second transmission from the WTRU, the second transmission comprising block coded second feedback bits, wherein CRC bits are not coded with the second feedback bits in the second transmission; and
 decode the block coded second feedback bits.

\* \* \* \* \*